United States Patent
Yu et al.

(10) Patent No.: US 12,321,023 B2
(45) Date of Patent: Jun. 3, 2025

(54) OPTICAL TRANSCEIVER MODULES AND HEAT MANAGEMENT TECHNIQUES THEREFOR

(71) Applicant: Molex, LLC, Lisle, IL (US)

(72) Inventors: Shiping Yu, San Diego, CA (US); Mark Harrison, Escondido, CA (US)

(73) Assignee: Molex, LLC, Lisle, IL (US)

( * ) Notice: Subject to any disclaimer, the term of this patent is extended or adjusted under 35 U.S.C. 154(b) by 0 days.

(21) Appl. No.: 18/234,896

(22) Filed: Aug. 17, 2023

(65) Prior Publication Data
US 2023/0393356 A1    Dec. 7, 2023

Related U.S. Application Data

(63) Continuation of application No. 17/338,728, filed on Jun. 4, 2021, now Pat. No. 11,774,693.

(60) Provisional application No. 63/037,005, filed on Jun. 10, 2020.

(51) Int. Cl.
| | |
|---|---|
| *H04B 10/00* | (2013.01) |
| *G02B 6/42* | (2006.01) |
| *H05K 7/20* | (2006.01) |

(52) U.S. Cl.
CPC ......... *G02B 6/4269* (2013.01); *G02B 6/4284* (2013.01); *H05K 7/20418* (2013.01)

(58) Field of Classification Search
CPC ............... G02B 6/4269; G02B 6/4284; H05K 7/20418; H05K 7/20336
See application file for complete search history.

(56) References Cited

U.S. PATENT DOCUMENTS

| | | | | |
|---|---|---|---|---|
| 7,286,346 B2* | 10/2007 | Chiba | ................... | G06F 1/1632 361/679.48 |
| 7,674,012 B1* | 3/2010 | Lin | ........................ | F21V 29/83 362/240 |
| 7,764,504 B2* | 7/2010 | Phillips | .............. | H01R 13/6582 174/15.2 |
| 8,879,267 B2* | 11/2014 | Henry | ................. | H04L 12/6418 361/709 |
| 9,343,851 B2* | 5/2016 | Bucher | ............... | G02B 6/4274 |
| 9,389,368 B1* | 7/2016 | Sharf | ..................... | H01R 27/02 |
| 9,407,028 B2* | 8/2016 | Han | ..................... | H01R 13/506 |
| 9,429,370 B1* | 8/2016 | Thomsen | ........... | H05K 7/20336 |
| 9,518,785 B2* | 12/2016 | Szczesny | ............. | G02B 6/4269 |
| 9,622,388 B1* | 4/2017 | Van Gaal | .............. | H05K 7/207 |
| 9,668,378 B2* | 5/2017 | Phillips | ............. | H05K 7/20418 |
| 9,936,580 B1* | 4/2018 | Vinciarelli | .............. | H05K 3/36 |
| 9,983,370 B1* | 5/2018 | Mahoney | ............. | G02B 6/4269 |
| 10,091,911 B2* | 10/2018 | Kelty | ................... | G02B 6/4269 |

(Continued)

*Primary Examiner* — Agustin Bello

(57) ABSTRACT

An I/O connector includes a body comprising a first surface, a second surface, side surfaces extending between the first surface and the second surface, and a cable entrance port at a rear end of the body extending toward a front end of the body. The I/O connector includes a printed circuit board (PCB) positioned between the first surface and the second surface of the body. The PCB includes a first set of one or more electrical components mounted on a first side of the PCB. A first heatsink is disposed on the first surface. The I/O connector includes first heatpipe thermally coupled with the first heatsink and the first set of one or more electrical components, positioned between the first surface and the first side of the PCB.

20 Claims, 3 Drawing Sheets

(56) References Cited

U.S. PATENT DOCUMENTS

| | | | |
|---|---|---|---|
| 10,114,182 B2* | 10/2018 | Zbinden | G02B 6/4268 |
| 10,121,727 B1* | 11/2018 | Lucas | H05K 7/20418 |
| 10,225,953 B2* | 3/2019 | Gernert | H01L 23/3733 |
| 10,295,767 B2* | 5/2019 | Chen | G02B 6/4269 |
| 10,368,464 B2* | 7/2019 | Chen | G02B 6/4266 |
| 10,455,739 B2* | 10/2019 | Su | H05K 7/20509 |
| 10,477,729 B2* | 11/2019 | Han | H05K 7/1401 |
| 10,555,437 B2* | 2/2020 | Little | H05K 7/20336 |
| 10,588,243 B2* | 3/2020 | Little | H05K 7/20418 |
| 10,617,034 B2* | 4/2020 | Hubahib Gaviola | H05K 5/0004 |
| 10,765,032 B2* | 9/2020 | Lunsman | H05K 7/20263 |
| 10,788,637 B2* | 9/2020 | Ikonomov | G02B 6/4269 |
| 10,942,322 B2* | 3/2021 | Lu | G02B 6/4277 |
| 10,993,352 B2* | 4/2021 | Bucher | H01R 12/716 |
| 11,051,431 B2* | 6/2021 | Marcoccia | H05K 7/20836 |
| 11,064,633 B2* | 7/2021 | Wang | H01R 13/518 |
| 11,112,572 B2* | 9/2021 | Tittenhofer | H05K 7/1491 |
| 11,177,614 B2* | 11/2021 | Guetig | H01R 13/26 |
| 11,249,264 B2* | 2/2022 | Edwards, Jr. | G02B 6/428 |
| 11,266,040 B2* | 3/2022 | Uchino | H05K 7/20336 |
| 11,266,043 B2* | 3/2022 | Chen | G06F 1/206 |
| 11,271,348 B1* | 3/2022 | Chen | H05K 7/20418 |
| 11,454,774 B2* | 9/2022 | Hsiao | H01R 13/66 |
| 11,653,477 B2* | 5/2023 | Marcoccia | H05K 7/20663 165/80.4 |
| 11,774,693 B2* | 10/2023 | Yu | H05K 7/20336 385/92 |
| 11,916,579 B2* | 2/2024 | Wall, Jr. | G02B 6/4269 |
| 12,071,728 B2* | 8/2024 | Oishi | D21H 23/48 |
| 2005/0195565 A1* | 9/2005 | Bright | H05K 7/20418 361/688 |
| 2006/0291171 A1* | 12/2006 | Ahrens | H01L 23/427 257/E23.088 |
| 2007/0058347 A1* | 3/2007 | Tsai | H01L 23/427 257/E23.088 |
| 2007/0064397 A1* | 3/2007 | Chiba | G06F 1/203 361/679.48 |
| 2008/0285236 A1* | 11/2008 | Phillips | G02B 6/4246 361/709 |
| 2008/0308259 A1* | 12/2008 | Garner | F28D 15/046 165/104.21 |
| 2009/0040760 A1* | 2/2009 | Chen | F21V 29/89 362/373 |
| 2009/0223647 A1* | 9/2009 | Alousi | F28D 15/0233 165/80.3 |
| 2013/0210269 A1* | 8/2013 | Neer | G02B 6/4269 403/326 |
| 2013/0279115 A1* | 10/2013 | Blumenthal | H05K 7/20336 361/700 |
| 2014/0153192 A1* | 6/2014 | Neer | H05K 9/0058 361/704 |
| 2014/0160679 A1* | 6/2014 | Kelty | G02B 6/4269 361/700 |
| 2014/0302713 A1* | 10/2014 | Su | H01R 12/7082 439/607.35 |
| 2015/0013936 A1* | 1/2015 | Mack | F28F 1/32 165/53 |
| 2015/0029667 A1* | 1/2015 | Szczesny | G02B 6/4261 361/700 |
| 2015/0342085 A1* | 11/2015 | Mckervey | H05K 9/0007 165/80.3 |
| 2016/0093996 A1* | 3/2016 | Phillips | H05K 7/20418 439/487 |
| 2016/0149324 A1* | 5/2016 | Regnier | H01R 43/205 29/874 |
| 2016/0197424 A1* | 7/2016 | L'Esperance | G02B 6/4268 439/61 |
| 2016/0211623 A1* | 7/2016 | Sharf | G02B 6/4261 |
| 2017/0077643 A1* | 3/2017 | Zbinden | G02B 6/4268 |
| 2017/0135246 A1* | 5/2017 | Lunsman | H05K 7/20254 |
| 2017/0164459 A1* | 6/2017 | Kim | H05K 1/0203 |
| 2017/0295640 A1* | 10/2017 | Tsunoda | H05K 1/0272 |
| 2018/0199468 A1* | 7/2018 | Hall, III | G02B 6/4261 |
| 2018/0368283 A1* | 12/2018 | Little | G02B 6/428 |
| 2019/0044299 A1* | 2/2019 | Kazav | H01R 31/06 |
| 2019/0115684 A1* | 4/2019 | Khazen | G02B 6/4446 |
| 2019/0116692 A1* | 4/2019 | Little | H01R 13/6594 |
| 2019/0181582 A1* | 6/2019 | Beltran | H01R 13/514 |
| 2019/0182985 A1* | 6/2019 | Gaviola | H05K 7/20409 |
| 2019/0230817 A1* | 7/2019 | Han | F28F 3/06 |
| 2019/0394904 A1* | 12/2019 | Lee | H05K 1/0209 |
| 2020/0008321 A1* | 1/2020 | Marcoccia | F28D 15/06 |
| 2020/0049912 A1* | 2/2020 | Lu | H05K 9/0058 |
| 2020/0142142 A1* | 5/2020 | Luo | H05K 7/2039 |
| 2020/0221607 A1* | 7/2020 | Bucher | H01R 12/716 |
| 2020/0232715 A1* | 7/2020 | Hanafusa | F28D 15/0275 |
| 2021/0072472 A1* | 3/2021 | Curtis | G02B 6/4269 |
| 2021/0072473 A1* | 3/2021 | Wall, Jr. | H05K 7/2039 |
| 2021/0105025 A1* | 4/2021 | Wall, Jr. | H04B 10/116 |
| 2021/0112683 A1* | 4/2021 | Mohajer | G02B 6/4261 |
| 2021/0141175 A1* | 5/2021 | Wang | G02B 6/4269 |
| 2021/0212193 A1* | 7/2021 | Deng | H05K 7/20409 |
| 2021/0325616 A1* | 10/2021 | Lands | G02B 6/4278 |
| 2021/0389534 A1* | 12/2021 | Yu | H05K 7/20418 |
| 2022/0003946 A1* | 1/2022 | Edwards, Jr. | H04B 10/40 |
| 2022/0099903 A1* | 3/2022 | Tsai | G02B 6/4269 |
| 2022/0240416 A1* | 7/2022 | Lunsman | H05K 7/20809 |
| 2022/0252800 A1* | 8/2022 | Myhre | H05K 7/20454 |
| 2023/0039781 A1* | 2/2023 | Mohajer | H05K 7/20254 |
| 2023/0393356 A1* | 12/2023 | Yu | G02B 6/4284 |
| 2024/0049434 A1* | 2/2024 | Mohajer | H05K 7/20254 |

* cited by examiner

OPTICAL TRANSCEIVER MODULES AND HEAT MANAGEMENT TECHNIQUES THEREFOR

CROSS-REFERENCE TO RELATED APPLICATION

This application is a continuation application of U.S. patent application Ser. No. 17/338,728, filed on Jun. 4, 2021, which is based upon and claims priority to U.S. Provisional Patent Application No. 63/037,005, filed on Jun. 10, 2020, the entire disclosures of which are incorporated herein by reference in their entireties for all purposes.

TECHNICAL FIELD

This disclosure relates to the field of input/output (I/O) connectors, more specifically to a transceiver module and heat management techniques suitable for use in high data rate applications.

DESCRIPTION OF RELATED ART

Input/output (I/O) connectors are commonly used in applications where high bandwidth is desired and are commonly used to provide connectivity between boxes or racks of computers, routers and switches. One such commonly used format of an I/O connector is a Quad Small Form Factor-Double Density Pluggable (QSFP-DD) connector. This connector includes an optical transceiver module and associated components that are defined by standard bodies and such that reliable performance is provided regardless of the vendor. For example, QSFP-DD transceiver modules are made within the QSFP-DD Multi Source Agreement (MSA) specification which has been adopted by manufacturers.

As data rates have increased, one issue that has been difficult to overcome is the physical limitation of medium that is used to transmit signals. Passive cables, for example, are cost effective for shorter distances but tend to be limited with respect to distance as signal frequencies increase. Active copper and fiber optic cables are well suited to transmit signals over longer distances but require power and thus tend to create thermal issues. One of the major issues with the increased use of active cables assemblies is the increased thermal burden the use of such cable assemblies place on the connector system. Furthermore, as higher data rates and/or power usage are implemented in the optical transceiver module and other I/O connectors, additional heat is generated.

SUMMARY

The appended claims may serve as a summary of the disclosure.

BRIEF DESCRIPTION OF THE DRAWINGS

The present disclosure is illustrated by way of example and not limited in the accompanying figures in which like reference numerals indicate similar elements and in which.

Figure 1:
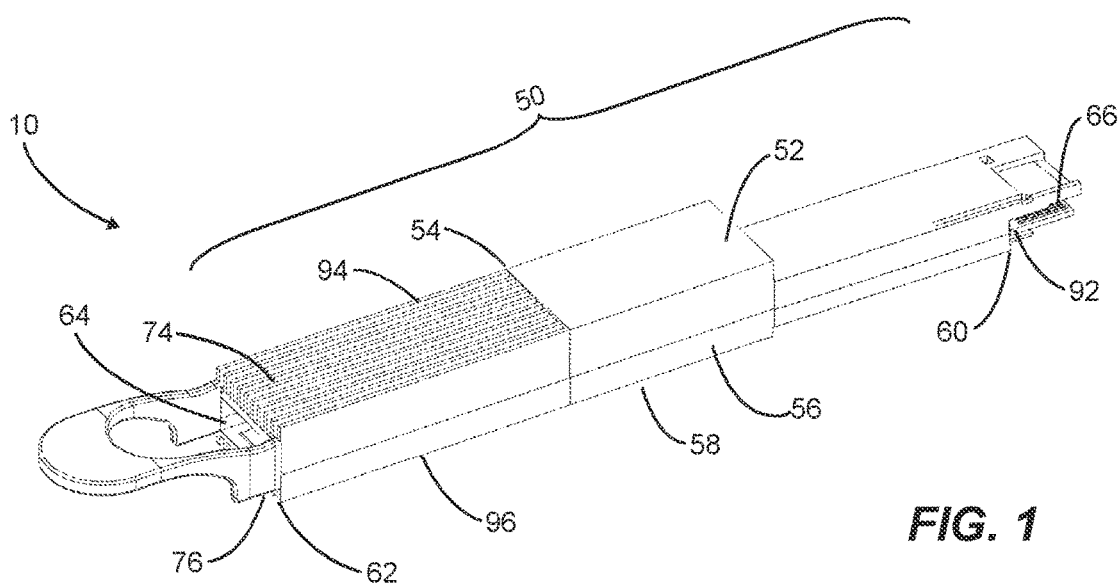
FIG. 1 is a top perspective view of an I/O connector in an example embodiment.

While each of the drawing figures illustrates a particular embodiment for purposes of illustrating a clear example, other embodiments may omit, add to, reorder, or modify any of the elements shown in the drawing figures. For purposes of illustrating clear examples, one or more figures may be described with reference to one or more other figures. However, using the particular arrangement illustrated in the one or more other figures is not required in other embodiments.

DETAILED DESCRIPTION

In the following description, for the purpose of explanation, numerous specific details are set forth in order to provide a thorough understanding of the present disclosure. It will be apparent, however, that the present disclosure may be practiced without these specific details. The detailed description that follows describes exemplary embodiments and the features disclosed are not intended to be limited to the expressly disclosed combination(s). Therefore, unless otherwise noted, features disclosed herein may be combined together to form additional combinations that were not otherwise shown for purposes of brevity.

It will be further understood that: the term "or" may be inclusive or exclusive unless expressly stated otherwise; the term "set" may comprise zero, one, or two or more elements; the terms "first", "second", "certain", and "particular" are used as naming conventions to distinguish elements from each other does not imply an ordering, timing, or any other characteristic of the referenced items unless otherwise specified; the term "and/or" as used herein refers to and encompasses any and all possible combinations of one or more of the associated listed items; that the terms "comprises" and/or "comprising" specify the presence of stated features, but do not preclude the presence or addition of one or more other features. The detailed description that follows describes exemplary embodiments and the features disclosed are not intended to be limited to the expressly disclosed combination(s). Therefore, unless otherwise noted, features disclosed herein may be combined together to form additional combinations that were not otherwise shown for purposes of brevity.

General Overview

This document generally describes systems, methods, devices, and other techniques for optical transceiver modules and heat management techniques therefor.

One or more embodiments described herein are directed to an I/O connector that includes a body comprising a first surface, a second surface, side surfaces extending between the first surface and the second surface, and a cable entrance port at a rear end of the body extending toward a front end of the body. The I/O connector includes a printed circuit board (PCB) positioned between the first surface and the second surface of the body. The PCB includes a first set of one or more electrical components mounted on a first side of the PCB. A first heatsink is disposed on the first surface. The I/O connector includes a first heatpipe thermally coupled with the first heatsink and the first set of one or more electrical components, positioned between the first surface and the first side of the PCB.

One or more embodiments described herein are directed to an I/O connector that includes a body comprising a first surface, a second surface, side surfaces extending between the first surface and the second surface, and a cable entrance port at a rear end of the body extending toward a front end of the body. The I/O connector includes a PCB positioned between the first surface and the second surface of the body. The PCB includes an edge connector extending from the front end of the body. The I/O connector has a pluggable portion comprising the front end of the body, the pluggable portion configured to seat within a cage defined by a standard specification and an external portion comprising the rear end of the body. The I/O connector has a first heatsink disposed on the first surface, the first heatsink comprising a first plurality of conductive fins disposed on a section of the first surface belonging to the external portion.

One or more embodiments described herein are directed to a chassis. The chassis includes a front panel with perforations that allow air to pass through the front panel. The chassis includes a front upper baffle that extends beyond the front panel toward a front end of the chassis. The front upper baffle may be attached or part of a top panel of the chassis or the front panel. The chassis includes a front lower baffle that extends beyond the front panel toward a front end of the chassis. The front lower baffle may be attached or part of a bottom panel of the chassis or the front panel. The front panel has an array of one or more port openings configured to receive a pluggable portion of a plurality of I/O connectors such that an external portion of the plurality of I/O connectors are positioned between the front upper baffle and the front lower baffle. The chassis has a set of one or more fan mounts configured to receive a set of one or more fans that, when powered, cause an airflow between the front end of the chassis toward a rear end of the chassis so that the front upper baffle and the front lower baffle direct the airflow over an external portion of the plurality of I/O connectors.

In some implementations, the various techniques described herein may achieve one or more of the following advantages: improved thermal management for an I/O connector and systems including one or more I/O connectors; improved thermal management in an optical transceiver module, a chassis therefor, and systems including one or more optical transceiver modules; improved thermal management in a QSFP-DD module, a chassis therefor, and systems including one or more QSFP-DD modules; improved airflow for thermal management. Additional features and advantages are apparent from the specification and the drawings.

Module with Heatsink Integration

FIG. 1 is a top perspective view of an I/O connector in an example embodiment. An I/O connector 10 includes a body 50 having a top surface 52, side surfaces 54, 56 depending downwardly from the top surface 52, and a bottom surface 58 connected to bottom ends of the side surfaces 54, 56. The side surfaces 54, 56 extend between the top surface 52 and the bottom surface 58. The body 50 may be formed from a thermally conductive material. The body 50 can be formed in a variety of ways, such as but not limited to die casting, stamping, forming, machining, and/or other manufacturing processes. The body 50 defines a front end 60 of the body 50 and a rear end 62 of the body 50 at the opposite end of the front end 60.

A printed circuit board (PCB) 92 is positioned between the top surface 52 and the bottom surface 58 of the body 50. In some embodiments, the PCB 92 is offset toward the bottom surface 58 or the top surface 62. In some embodiments, the PCB 92 is a paddle card that is used to adapt one device to another. For example, the PCB 92 may have an edge connector 66 that plugs into a slot on another device. The edge connector 66 may include a set of contact pads positioned adjacent each other along a mating direction. The edge connector 66 may be positioned toward the front end 60 of the body 50, and may extend from the front end 60 of the body 50 in some embodiments.

The rear end 62 includes a cable entrance port 64 comprising a passageway that extends from the rear end 62 of the body 50 toward the front end 60 of the body 50 from the cable entrance port 64. A receiving element may be positioned within the cable entrance port 64. The receiving element is configured to electronically couple and/or communicatively couple a cable, such as a fiber optic cable, to the PCB 92. For example, the receiving element may couple the PCB 92 to a cable so that electronic signals, optical signals, and/or other signals may be transmitted between the PCB 92 and the cable.

In some embodiments, the I/O connector 10 has a double density configuration. In a double density configuration, the PCB 92 includes two rows of contact pads positioned adjacent each other along a mating direction. For example, the PCB 92 may have an edge connector 66 comprising two rows of terminals spaced along the mating direction, each of which engage respective contact pads.

The I/O connector 10 may include a transmitter, converter, and/or receiver. In some embodiments, the I/O connector 10 is a transceiver module, such as but not limited to an optical transceiver module. The PCB 92 may perform and unidirectional and/or bidirectional data conversion between digital data and optical data. Optical signals may be transmitted and received over a fiber optic cable that is inserted via the cable entrance port 64 and electronically coupled and/or communicatively coupled with the PCB 92.

The I/O connector 10 may include one or more heatsinks 94, 96 disposed on one or more surfaces of the body 50, such as but not limited to the top surface 52 and/or the bottom surface 58. The one or more heatsinks 94, 96 are arranged to conduct heat generated by the electronics and/or optics mounted within the body 50 for thermal dissipation, such as by convection. In some embodiments, the I/O connector includes a heatsink 94 disposed on the top surface 52 and/or a heatsink 96 disposed on the bottom surface 58 of the body 50.

The heatsinks 94, 96 may include a plurality of conductive fins 74, 76 disposed on and extending away from a surface of the body 50. The fins 74, 76 are arranged to conduct heat away from the body 50 and dissipate heat by convection. In some embodiments, the fins 74, 76 are elongated and extend from the rear end 62 toward the front end 60 such that elongated channels are formed between individual fins 74, 76. Alternatively and/or in addition, the fins 74, 76 may include an array of fins with intersecting channels creating a pillar-type arrangement.

One or more heatsinks 94, 96 may include fins 74, 76 that extend from a respective surface of the body 50, and/or channels that recess into the respective surface of the body 50 in some embodiments, a heatsink 94 disposed on the top surface 52 of the body 50 includes a plurality of fins 74 formed from thermally conductive material that extend from the top surface 52 of the body 50, and/or channels in the thermally conductive material that recess into the top surface 52 of the body 50. Alternatively and/or in addition, a heatsink 96 disposed on the bottom surface 58 of the body 50 may include a plurality of fins 76 formed from thermally conductive material that extend from the bottom surface 58 of the body 50, and/or channels in the thermally conductive material that recess into the bottom surface 58 of the body 50.

The fins 74, 76 may be integrally formed with the top surface 52 and/or bottom surface 58, such as, for example, but not limited to, by die casting, forming, machining, and/or other manufacturing processes. Alternatively and/or in addition, the fins 74, 76 may be separately formed from the body 50 and attached to the body 50 by any suitable means, such as but not limited to, fasteners, adhesives including thermally conductive adhesives, brazing, soldering, welding, and/or other assembly processes. In some embodiments, the fins 74, 76 are formed on a sleeve that overlays at least a portion of the body 50. The sleeve may be attached to the body 50 by any suitable means, such as but not limited to friction fit, fasteners, adhesives including thermally conductive adhesives, brazing, soldering, welding, and/or other assembly processes.

Figure 2:
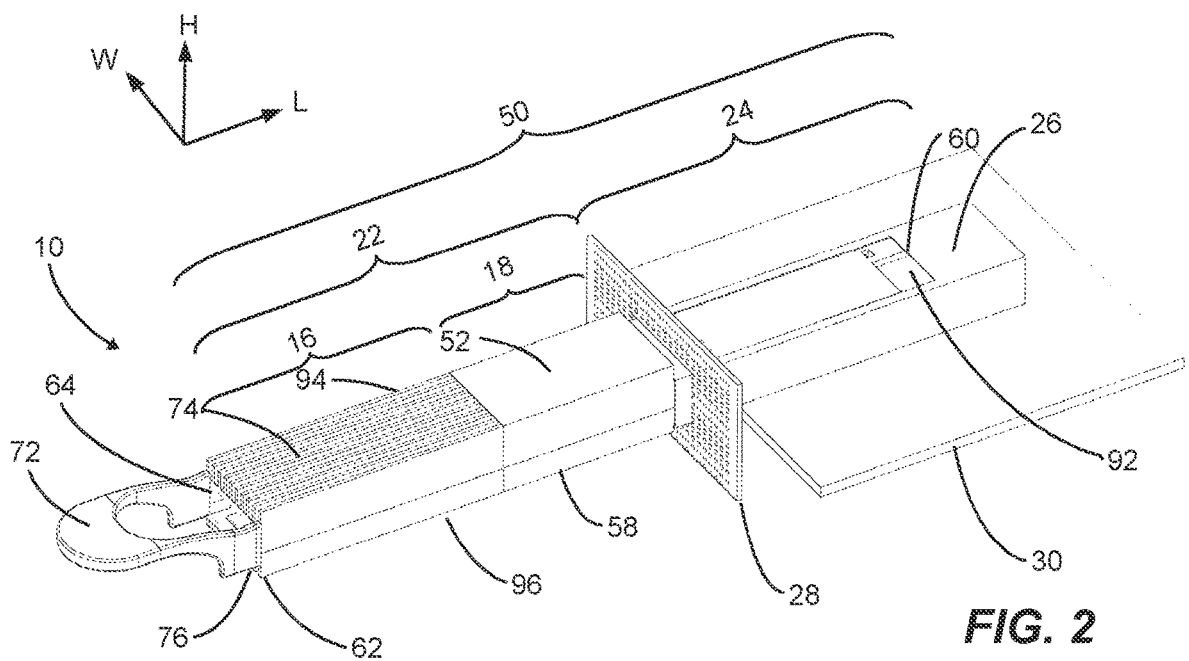
FIG. 2 is a top perspective view of an I/O connector and portions of a cage into which the I/O connector is inserted in an example embodiment.

FIG. 2 is a top perspective view of an I/O connector and portions of a cage into which the I/O connector is inserted in an example embodiment. An external portion 22 of the I/O connector 10 includes the rear end 62 of the body 50. A pluggable portion 24 of the I/O connector 10 includes the front end 60 of the body 50. The pluggable portion 24 is configured to seat within a cage 26. The cage 26 may be mounted on a device PCB 30 of an electronic device to receive the I/O connector 10.

In some embodiments, the cage 26 is engaged with a chassis panel 28 that mates with the front end of the cage 26. The chassis panel 28 is a portion of a chassis that serves as the structural support for electronic components, such as but not limited to the device PCB 30. The pluggable portion 24 may be inserted into the cage 26 through a port opening in the chassis panel 28 configured to receive one or more I/O connectors 10.

The fins 74, 76 may be disposed on a planar surface of the top surface 52 and/or the bottom surface 58, and may or may not extend along the entire length and/or the entire width of the respective surfaces 52, 58. In some embodiments, when the I/O connector 10 is inserted into the cage 26, the one or more heatsinks 94, 96 do not seat within the cage 26. In some embodiments, the fins 74 of a heatsink 94 disposed on the top surface 52 of the body 50 are disposed on a section of the top surface 52 belonging to the external portion 22 of the I/O connector 10. In some embodiments, the fins 76 of a heatsink 96 disposed on the bottom surface 58 of the body 50 are fins disposed on a section of the bottom surface 58 belonging to the external portion 22 of the I/O connector 10.

When the I/O connector 10 is inserted into a cage 26 mounted on a device PCB 30 of an electronic device, the I/O PCB 92 of the I/O connector is electronically coupled with the device PCB 30 of the electronic device. The cage 26 may include one or more components that electronically couple with the edge connector 66 of the I/O connector 10. For example, the cage 26 may include one or more mating connectors (not shown) that mate with an edge connector 66 of the I/O connector 10, thereby electronically coupling the device PCB 30 and the PCB 92 of the I/O connector. In some embodiments, the I/O connector 10 is an optical transceiver module that transmits digital signals received from the device PCB 30 of the electronic device, and receives optical signals received over a fiber optic cable inserted into the cable entrance port 64 of the I/O connector.

In some embodiments, the cage 26 includes one or more heat sinks (not shown) mounted on one or more external surfaces of the cage. The cage 26 may be formed by die casting, stamping, forming, machining, and/or other manufacturing processes. The cage 26 may be thermally conductive and forms a shield assembly for the components mounted therein, such as but not limited to the I/O connector 10, a fiber optic cable inserted in the cable entrance port 64, and/or other components.

In some embodiments, the I/O connector 10 is a Quad Small Form Factor-Double Density (QSFP-DD) transceiver module. Generally, a QSFP-DD transceiver module has dimensions and other characteristics that comply with the QSFP-DD Multi Source Agreement (MSA) specification. The I/O connector 10 may have one or more dimensions that comply with the QSFP-DD MSA specification. In some embodiments, dimensions of the pluggable portion 24 of the I/O connector 10, such as the length, width and height, comply with the QSFP-DD MSA specification.

Alternatively and/or in addition, one or more dimensions of the external portion 22 of the I/O connector 10 does not comply with the QSFP-DD MSA specification. In some embodiments, a length of the external portion 22 of the I/O connector 10 is longer than a length indicated in the QSFP-DD MSA specification for one or more types of QSFP-DD transceiver modules. In some embodiments, one or more heatsinks 94, 96 are disposed on an extension section 16 of the external portion 22 of the I/O connector 10 that exceeds a length indicated in the QSFP-DD MSA specification, and a remaining section 18 of the external portion 22 is the specified length indicated in the SQFP-DD MSA specification. In some embodiments, one or more heatsinks 94, 96 are disposed on the entire external portion 22 of the top surface 52 and/or the bottom surface 58.

In some embodiments, one or more fins 74, 76 extending from a surface of the body 50 may extend beyond one or more dimensions indicated in the QSFP-DD MSA specification for one or more types of QSFP-DD transceiver modules. In some embodiments, such dimensions exceeding specification dimensions for one or more types of QSFP-DD transceiver modules are added to the QSFP-DD MSA specification as an additional type of QSFP-DD transceiver module in the QSFP-DD MSA specification.

The I/O connector 10 may include a release tab 72 that facilitates insertion and/or removal of the I/O connector from the cage 26. The release tab 72 provides an accessible surface to be grasped by a user to facilitate insertion of the I/O connector 10 into the cage 26 when the user applies a pushing force, and to facilitate extraction of the I/O connector 10 from the cage 26 when the user applies a pulling force. The release tab 72 can be made of any suitable material, such as but not limited to plastic, composite, and/or other materials. The release tab 72 can be attached to the body 50 by any suitable means, including but not limited to overmolding, welding, clipping, gluing, and/or other assembly processes.

Module with Heatpipe Integration

Figure 3:
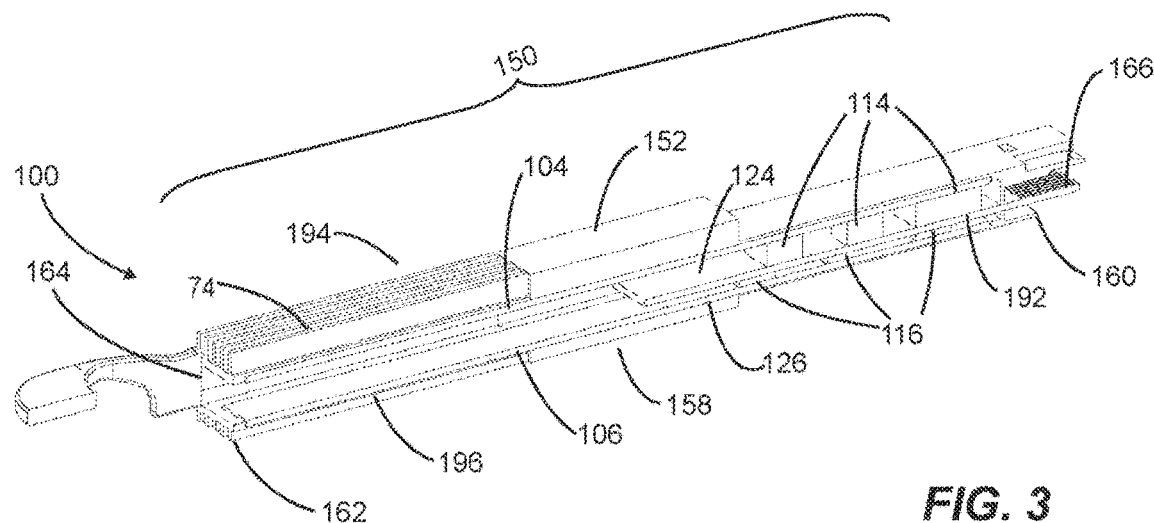
FIG. 3 is a top sectional perspective view of an I/O connector in an example embodiment.

FIG. 3 is a top sectional perspective view of an I/O connector in an example embodiment. An I/O connector 100 includes a body 150 having a top surface 152 and a bottom surface 158. The body may have side surfaces depending downwardly from the top surface 152 and connected to bottom ends of the side surfaces. The body 150 defines a front end 160 of the body 150 and an opposite rear end 162 of the body 150 in some embodiments, the I/O connector 100 may have one or more components and/or features described with respect to the I/O connector 10 of FIG. 1. Alternatively and/or in addition, the I/O connector 100 may omit one or more components and/or features described with respect to the I/O connector 10 of FIG. 1.

A PCB 192 is positioned between the top surface 152 and the bottom surface 158 of the body 150. In some embodiments, the PCB 192 is offset toward the bottom surface 158 or the top surface 152. In some embodiments, the PCB 192 is a paddle card that is used to adapt one device to another. For example, the PCB 192 may have an edge connector 166 that plugs into a slot on another device. The rear end 162 includes a cable entrance port 164 comprising a passageway that extends from the rear end 162 of the body 150 toward a front end 160 of the body 150 from the cable entrance port 164. A receiving element may be positioned within the cable entrance port 164. The receiving element is configured to electronically couple and/or communicatively couple a cable, such as a fiber optic cable, to the PCB 192.

The I/O connector 100 includes one or more heatsinks 194, 196 disposed on one or more surfaces of the body 150, such as but not limited to the top surface 152 and/or the bottom surface 158. The one or more heatsinks 194, 196 are arranged to conduct heat generated by the electronics and/or optics mounted within the body 150 for thermal dissipation by convection. In some embodiments, the I/O connector includes a heatsink 194 disposed on the top surface 152 and/or a heatsink 196 disposed on the bottom surface 158 of the body 150.

The I/O connector 100 includes one or more heatpipes 104, 106. The heatpipe/s 104, 106 are heat transfer devices that use thermal conductivity and phase transition to transfer heat away from a heat source in the I/O connector 100 for dissipation at one or more heatsinks 194, 196. A heatpipe 104, 106 may be positioned between a surface of the body 150 and the PCB 192.

Figure 4:
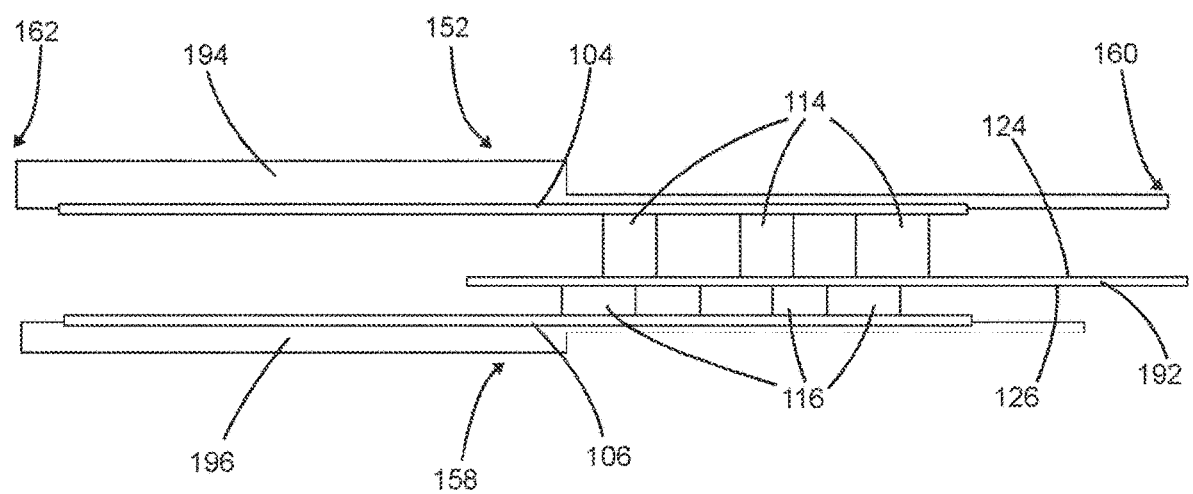
FIG. 4 is a side sectional view of a portion of the I/O connector of FIG. 3 in an example embodiment.

FIG. 4 is a side sectional view of a portion of the I/O connector of FIG. 3 in an example embodiment. In some embodiments, an upper heatpipe 104 is positioned between a top side 124 of the PCB 192 and a top surface 152 of the body 150. A set of one or more upper electrical components 114 are mounted on the top side 124 of the PCB 192. The upper heatpipe 104 runs along at least a portion of the length of the body 150. The upper electrical component/s 114 are thermally coupled with the upper heatpipe 104 toward a front end 160 of the body. An upper heatsink 194 disposed on the top surface 152 of the body 150 is thermally coupled with the upper heatpipe 104 toward a rear end 162 of the body 150. The upper heatpipe 104 transfers heat away from the upper electrical component/s 114 to the upper heatsink 194, where the heat is dissipated.

Alternatively and/or in addition, a lower heatpipe 106 is positioned between a bottom side 126 of the PCB 192 and a bottom surface 158 of the body 150. A set of one or more lower electrical components 116 are mounted on bottom top side 126 of the PCB 192. The lower heatpipe 106 runs along at least a portion of the length of the body 150. The lower electrical component/s 116 are thermally coupled with the lower heatpipe 106 toward a front end 160 of the body. A lower heatsink 196 disposed on the bottom surface 158 of the body 150 is thermally coupled with the lower heatpipe 106 toward a rear end 162 of the body 150. The lower heatpipe 106 transfers heat away from the lower electrical component/s 116 to the lower heatsink 196, where the heat is dissipated.

The heatpipe/s 104, 106 may be attached or otherwise thermally coupled to the body 150 by any suitable means, such as but not limited to, fasteners, adhesives including thermally conductive adhesives, brazing, soldering, welding, and/or other assembly processes. The heatpipe/s 104, 106 may be attached or otherwise thermally coupled to the electrical component/s 114, 116 of the PCB 192 by any suitable means, such as but not limited to, fasteners, adhesives including thermally conductive adhesives, brazing, soldering, welding, and/or other assembly processes.

Electrical components 114, 116 mounted to the PCB 192 may be coupled with a heatpipe 104, 106 based on the need for thermal management. For example, electrical components 114, 116 that generate excess heat, may include one or more Transmitter Optical Sub Assemblies (TOSAs), Receiver Optical Sub Assemblies (ROSAs), Bi-Directional Optical Sub Assemblies (BOSAs), Coherent Optical Sub Assemblies (COSAs), Digital Signal Processors (DSPs), or other electrical components.

In some embodiments, the I/O connector 100 is a Quad Small Form Factor-Double Density (QSFP-DD) transceiver module. The I/O connector 100 may have one or more dimensions that comply with the QSFP-DD MSA specification. In some embodiments, dimensions of a pluggable portion of the I/O connector 100, such as the length, width and height, comply with the QSFP-DD MSA specification.

Alternatively and/or in addition, one or more dimensions of an external portion of the I/O connector 100 does not comply with the QSFP-DD MSA specification. In some embodiments, a length of the external portion of the I/O connector 100 is longer than a length indicated in the QSFP-DD MSA specification for one or more types of QSFP-DD transceiver modules. Alternatively and/or in addition, one or more fins of a heatsink 194, 196 extending from a surface of the body 150 may extend beyond one or more dimensions indicated in the QSFP-DD MSA specification for one or more types of QSFP-DD transceiver modules. In some embodiments, such dimensions exceeding specification dimensions for one or more types of QSFP-DD transceiver modules are added to the QSFP-DD MSA specification as an additional QSFP-DD transceiver module type in the QSFP-DD MSA specification.

Extended Chassis for Directed Airflow

Figure 5:
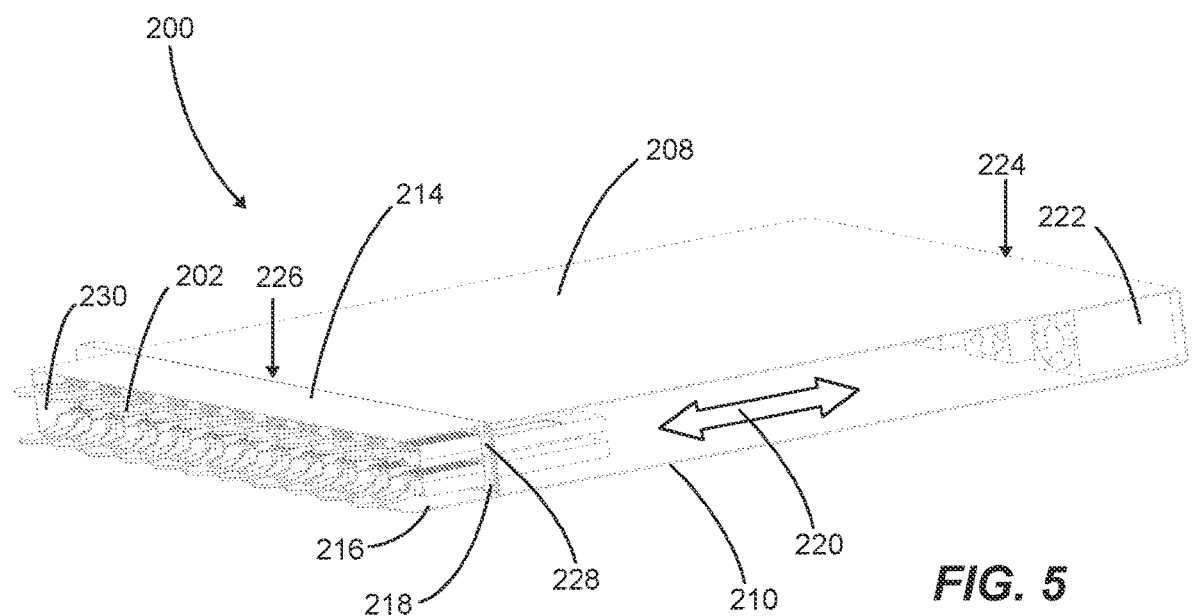
FIG. 5 is a top sectional perspective view of a chassis with a set of I/O connectors in an example embodiment.

FIG. 5 is a top sectional perspective view of a chassis with one a set of I/O connectors in an example embodiment. The chassis 200 includes a set of panels that includes a front panel 218, a top panel 208, a bottom panel 210. The chassis 200 may also have one or more side panels and/or a rear panel extending between the top panel 208 and the bottom panel 210. One or more panels of the chassis 200 may be formed separately and/or together, and can be formed in a variety of ways, such as, but not limited to, die casting, stamping, forming, machining, and/or other manufacturing processes.

The front panel 218 has perforations, such as holes, slots, mesh, and/or other openings, that allow air to pass through the front panel 218. The front panel 218 has an array of one or more port openings 228 configured to receive one or more I/O connectors 202, such as but not limited to transceiver modules such as QSFP-DD transceiver modules. The port openings 228 may be arranged in one or more rows. The I/O connectors 202 may be arranged in the same orientation or a different orientation. For example, the I/O connectors 202 may be arranged such that a bottom surface (e.g., bottom surface 58) of a first row of I/O connectors 202 is facing the bottom surface of a second row of I/O connectors 202. Alternatively and/or in addition, a top surface (e.g. top surface 52) of a row of I/O connectors 202 may face the top surface of another row of I/O connectors 202. Alternatively and/or in addition, two or more rows of I/O connectors 202 may be arranged such that a bottom surface of a first row of I/O connectors 202 is facing the top surface of a second row of I/O connectors 202.

The chassis 200 may include or receive one or more electronic components that include a set of cages (e.g., cage 26) that receive a pluggable portion (e.g., pluggable portion 24) of the I/O connectors 202. In some embodiments, the chassis 200 includes mounts configured to receive one or more electronic devices and/or PCBs that include one or more arrays of cages that receive the I/O connectors.

The chassis 200 includes a front upper baffle 214 that extends beyond the front panel 218 at a front end 226 of the chassis 200. The front upper baffle 214 may be integrally formed with the top panel 208 and/or the front panel 218, such as, for example, but not limited to, by die casting, stamping, forming, machining, and/or other manufacturing processes. Alternatively and/or in addition, the front upper baffle 214 may be separately formed and attached to the top panel 208, the front panel 218, or another portion of the chassis 200 by any suitable means, such as but not limited to, fasteners, adhesives including thermally conductive adhesives, brazing, soldering, welding, and/or other assembly processes. The front upper baffle 214 may be formed from one or more materials, such as but not limited to one or more metals, plastics, composites, and/or other materials.

In some embodiments, the chassis 200 includes one or more side baffles 230 that extend beyond the front panel 218 at a front end 226 of the chassis 200. For example, a side baffle 230 may extend between the front upper baffle 214 and the front lower baffle 216 at a first side of the chassis 200. An additional side baffle (not shown) may extend between the front upper baffle 214 and the front lower baffle 216 at a second side of the chassis 200 that is opposite of the first side of the chassis 200.

The side baffle/s 230 may be integrally formed with one or more side panels of the chassis, such as, for example, but not limited to, by die casting, stamping, forming, machining, and/or other manufacturing processes. Alternatively and/or in addition, the side baffle/s 230 may be separately formed and attached to the top panel 208, the front panel 218, or another portion of the chassis 200 by any suitable means, such as but not limited to, fasteners, adhesives including thermally conductive adhesives, brazing, soldering, welding, and/or other assembly processes. The side baffle/s 230 may be formed from one or more materials, such as but not limited to one or more metals, plastics, composites, and/or other materials. In some embodiments, one or more of the side baffle/s 230, the front upper baffle 214, and the front lower baffle 216 are integrally formed with each other. Alternatively and/or in addition, one or more of the side baffle/s 230, the front upper baffle 214, and the front lower baffle 216 are separately formed.

The chassis 200 includes a front lower baffle 216 that extends beyond the front panel 218 at a front end 226 of the chassis. The front lower baffle 216 may be integrally formed with the bottom panel 210 and/or the front panel 218, such as, for example, but not limited to, by die casting, forming, stamping, machining, plastic injection molding, and/or other manufacturing processes. Alternatively and/or in addition, the front lower baffle 216 may be separately formed and attached to the lower panel 210, the front panel 218, or another portion of the chassis 200 by any suitable means, such as but not limited to, fasteners, adhesives including thermally conductive adhesives, brazing, soldering, welding, and/or other assembly processes. The front lower baffle 216 may be formed from one or more materials, such as but not limited to one or more metals, plastics, composites, and/or other materials.

When the I/O connectors such 202 are plugged into the chassis 200 through the port openings 228, an eternal portion (e.g., external portion 22) of the plurality of I/O connectors 202 are positioned between the front upper baffle 214 and the front lower baffle 216 and optional side baffle/s 230. In some embodiments, the front upper baffle 214 and/or the front lower baffle 216 and/or optional side baffle/s 230 extend to or beyond a rear end (e.g., rear end 62) of a body (e.g., body 50) of the I/O connectors 202 when the I/O connectors 202 are plugged into the chassis 200.

The chassis 200 may include a set of one or more fans 222 that, when powered, cause an airflow 220 between the front end 226 of the chassis 200 toward a rear end 224 of the chassis 200. Alternatively and/or in addition, the chassis 200 may have a set of one or more fan mounts configured to receive the set of one or more fans 222. The fan/s 222 may pull air through the front panel 218 or push air through the front panel 218. In some embodiments, the fan/s 222 are positioned to direct the airflow 220 from the front end 226 toward the rear end 224. Alternatively, the fan/s 222 may be positioned to direct the airflow 220 from the rear end 224 toward the front end 226.

The front upper baffle 214, the front lower baffle 216, and optionally one or more side baffles 230, direct the airflow 220 over an external portion (e.g., external portion 22) of the plurality of I/O connectors 202 before or after the airflow 220 passes through the perforations of the front panel 218. In some embodiments, the external portion (e.g., external portion 22) of the I/O connectors 202 include one or more heatsinks (e.g., heatsink 94, 96), which may include one or more sets of conductive fins (74, 76). In some embodiments, the front upper baffle 214, the front lower baffle 216, and optionally one or more side baffles 230, direct the airflow 220 over the heatsinks of the I/O connectors 202 to improve cooling and thermal management. For example, when the I/O connectors 202 are I/O connector modules with one or more integrated heatpipes (e.g., heatpipes 104, 106), the airflow 220 increases the rate of heat dissipation at one or more heatsinks (e.g., heatsinks 194, 196) connected to the heatpipes, improving thermal management of heat generated by electrical components (e.g., electrical components 114, 116) coupled to the heatpipes.

Other Aspects of Disclosure

In the foregoing specification, embodiments are described with reference to specific details that may vary from implementation to implementation. Nevertheless, it will be understood that various modifications may be made without departing from the spirit and scope of the present disclosure. The examples set forth above are provided to those of ordinary skill in the art as a complete disclosure and description of how to make and use the embodiments of the disclosure, and are not intended to limit the scope of what the inventor/inventors regard as their disclosure. Modifications of the above-described modes for carrying out the methods and systems herein disclosed that are obvious to persons of skill in the art are intended to be within the scope of the present disclosure and the following claims. The sole and exclusive indicator of the scope of the disclosure, and what is intended by the applicants to be the scope of the disclosure, is the literal and equivalent scope of the set of claims that issue from this application, in the specific form in which such claims issue, including any subsequent correction.

What is claimed is:

1. An input/output (I/O) connector, comprising:
 a body comprising a first surface, a second surface, a cable entrance port at a rear end of the body extending toward a front end of the body, and a single level pluggable portion at a front end of the body, wherein the single level pluggable portion is configured to removably seat within a cage mounted on a first printed circuit board (PCB) of a separate electronic device;

a second PCB positioned between the first surface and the second surface of the body, wherein the second PCB comprises a first set of one or more electrical components mounted on a first side of the second PCB, and wherein the second PCB performs data conversion between digital data and optical data;

a first heatsink disposed on the first surface; and a first heatpipe positioned between the first surface and the first side of the second PCB, wherein;

the first heatpipe is thermally coupled with the first heatsink and the first set of the one or more electrical components, and the cage is separate from the single level pluggable portion.

2. The I/O connector of claim 1, wherein the first surface is selected from a top surface and a bottom surface of the body.

3. The I/O connector of claim 1, further comprising:

a second heatsink disposed on the second surface, wherein a second heatpipe is thermally coupled with the second heatsink and a second set of one or more electrical components mounted on a second side of the second PCB.

4. The I/O connector of claim 1, further comprising:

a receiving element positioned within the cable entrance port, wherein the receiving element is configured to communicatively couple a cable to the second PCB.

5. The I/O connector of claim 1, wherein the I/O connector is an optical transceiver module.

6. The I/O connector of claim 1, wherein the single level pluggable portion further comprises an external portion comprising the rear end of the body.

7. The I/O connector of claim 3, wherein the first heatsink comprises a first plurality of conductive fins disposed on a portion of the first surface belonging to an external portion of the I/O connector, the second heatsink comprises a second plurality of conductive fins disposed on a portion of the second surface belonging to the external portion of the I/O connector, and the first plurality of conductive fins are extending away from the first surface in a first direction, the second plurality of conductive fins are extending away from the second surface in a second direction, and the first direction and the second direction are two opposite directions.

8. The I/O connector of claim 1, wherein the I/O connector is a Quad Small Form Factor-Double Density (QSFP-DD) transceiver module.

9. The I/O connector of claim 8, wherein dimensions of the single level pluggable portion of the connector comply with the QSFP-DD Multi Source Agreement (MSA) specification.

10. A chassis configured to receive one or more I/O connectors, comprising:

a front panel comprising perforations that allow air to pass through the front panel;

a front upper baffle that extends beyond the front panel at a front end of the chassis;

a front lower baffle that extends beyond the front panel at the front end of the chassis;

one or more mounts configured to configured to receive to receive one or more electronic devices that are separate from the one or more I/O connectors; and an array of one or more port openings in the front panel configured to receive one or more I/O connectors such that a first heatsink of the one or more I/O connectors are positioned beyond the front panel and between the front upper baffle and the front lower baffle, wherein the one of the one or more I/O connectors comprises:

a body comprising a first surface, a second surface, a cable entrance port at a rear end of the body extending toward a front end of the body, and a single level pluggable portion at a front end of the body, wherein the single level pluggable portion is configured to removably seat within a separate cage mounted on a first printed circuit board (PCB) of one of the one or more electronic devices;

a second PCB positioned between the first surface and the second surface of the body, wherein the second PCB comprises a first set of one or more electrical components mounted on a first side of the second PCB, wherein the second PCB performs data conversion between digital data and optical data;

the first heatsink is disposed on the first surface;

a first heatpipe is positioned between the first surface and the first side of the second PCB, wherein the first heatpipe is thermally coupled with the first heatsink and the first set of one or more electrical components; and a set of one or more fans that, when powered, cause an airflow from between front end of the chassis toward a rear end of the chassis, wherein the front upper baffle and the front lower baffle direct the airflow over the first heatsink of the one or more I/O connectors.

11. An optical transceiver module, comprising:

a body comprising a first surface, a second surface, a cable entrance port at a rear end of the body extending toward a front end of the body, and a single level pluggable portion at a front end of the body, wherein the single level pluggable portion is configured to removably seat within a separate cage mounted on a first printed circuit board (PCB) of a separate electronic device;

a second PCB positioned between the first surface and the second surface of the body, wherein the second PCB comprises a first set of one or more electrical components mounted on a first side of the second PCB, and where the second PCB performs data conversion between digital data and optical data;

a first heatsink disposed on a first portion of the first surface;

a first heatpipe positioned between the first surface and a first side of the second PCB, wherein the first heatpipe is thermally coupled with the first heatsink and a first set of one or more electrical components.

12. The optical transceiver module of claim 11, wherein the first surface is selected from a top surface and a bottom surface of the body.

13. The optical transceiver module of claim 11, wherein the first heatsink comprises a first plurality of conductive fins disposed on a section of the first surface belonging to an external portion comprising the rear end of the body, and wherein when the optical transceiver module is seated within the cage, the first plurality of conductive fins do not seat within the cage.

14. The optical transceiver module of claim 13, wherein dimensions of the single level pluggable portion of the optical transceiver module comply with a standard specification.

15. The optical transceiver module of claim 14, wherein a length of the external portion of the optical transceiver module is longer than specified by the standard specification.

16. The optical transceiver module of claim 14, wherein a width and a height of the external portion of the optical transceiver module comply with the standard specification.

17. The optical transceiver module of claim 14, wherein the standard specification is the Quad Small Form Factor-Double Density (QSFP-DD) Multi Source Agreement (MSA) specification.

18. The optical transceiver module of claim 13, further comprising:
a second heatsink disposed on the second surface, wherein the second heatsink comprises a second plurality of conductive fins disposed on a section of the second surface belonging to the external portion; and wherein the first plurality of conductive fins are extending away from the first surface in a first direction, the second plurality of conductive fins are extending away from the second surface in a second direction, and the first direction and the second direction are two opposite directions.

19. The optical transceiver module of claim 11, wherein the first PCB comprises an edge connector extending from the front end of the body, and wherein the cage is mounted on the first PCB.

20. A chassis configured to receive one or more optical transceiver modules of claim 11, the chassis comprising:
a front panel comprising perforations that allow air to pass through the front panel;
a front upper baffle that extends beyond the front panel at a front end of the chassis;
a front lower baffle that extends beyond the front panel at the front end of the chassis;
an array of one or more port openings in the front panel configured to receive the one or more optical transceiver modules such that the first heatsink of the one or more of optical transceiver modules are positioned beyond the front panel and between the front upper baffle and the front lower baffle; and
a set of one or more fans that, when powered, cause an airflow between the front end of the chassis toward a rear end of the chassis, wherein the front upper baffle and the front lower baffle direct the airflow over the first heatsink of the one or more optical transceiver modules.

* * * * *